(12) United States Patent
Nakagawa

(10) Patent No.: US 7,803,720 B2
(45) Date of Patent: Sep. 28, 2010

(54) COATING PROCESS AND EQUIPMENT FOR REDUCED RESIST CONSUMPTION

(75) Inventor: Seiji Nakagawa, Oita (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 163 days.

(21) Appl. No.: 12/019,981

(22) Filed: Jan. 25, 2008

(65) Prior Publication Data

US 2009/0191720 A1    Jul. 30, 2009

(51) Int. Cl.
*H01L 21/31* (2006.01)

(52) U.S. Cl. ............... 438/782; 257/E21.487; 118/708

(58) Field of Classification Search ......... 438/782; 257/E21.487; 118/708
See application file for complete search history.

(56) References Cited

U.S. PATENT DOCUMENTS

| | | | | |
|---|---|---|---|---|
| 5,857,619 A | * | 1/1999 | Huang et al. | 239/11 |
| 6,074,946 A | * | 6/2000 | Ouellet et al. | 438/689 |
| 6,376,013 B1 | * | 4/2002 | Rangarajan et al. | 427/240 |
| 6,758,908 B2 | * | 7/2004 | Whitman | 118/697 |
| 2006/0003468 A1 | * | 1/2006 | DeMuynck et al. | 438/1 |
| 2006/0121741 A1 | * | 6/2006 | Park | 438/758 |
| 2009/0227120 A1 | * | 9/2009 | Liu et al. | 438/782 |

FOREIGN PATENT DOCUMENTS

JP    2000-288458 A    10/2000

* cited by examiner

*Primary Examiner*—Charles D Garber
*Assistant Examiner*—Stanetta D Isaac
(74) *Attorney, Agent, or Firm*—Banner & Witcoff, Ltd.

(57) ABSTRACT

A coating system and method of coating semiconductor wafers is disclosed that is able to maintain a wet condition on the outer portion of the semiconductor wafer to provide ease of spreading for a photo-resist or anti-reflective coating (ARC) that is being dispensed. The system can include a plurality of nozzles on a movable arm. A first nozzle dispenses a pre-wet solvent onto the semiconductor wafer. A second nozzle then dispenses the photo-resist or ARC coating onto the semiconductor wafer. A third nozzle dispenses additional pre-wet solvent onto the outer edge of the semiconductor wafer as the photo-resist or ARC coating is being dispensed. The nozzles dispense solutions onto the semiconductor wafer as it rotates. The system produces semiconductor wafers with few coating defects and uses less photo-resist or ARC coating.

13 Claims, 6 Drawing Sheets

COATING PROCESS AND EQUIPMENT FOR REDUCED RESIST CONSUMPTION

BACKGROUND

The manufacture of semiconductor devices involves creating a semiconductor wafer and performing various processing techniques on the wafer. One such technique includes performing lithography by exposing the wafer with a projected image that depends upon circuitry design to be embodied on the wafer. Before projecting the image, a photo-resist coating and an anti-reflective coating (ARC) are applied to the surface of the wafer. To ensure that the projected image is properly exposed onto the wafer, it is important that the photo-resist and ARC coatings be smooth and coat the wafer completely.

In order to effectively coat the wafer surface with photo-resist and ARC coatings, the surface of the wafer must be covered with a pre-wet solvent. This pre-wet solvent is dispensed onto the wafer prior to the photo-resist and ARC coatings being dispensed. The pre-wet solvent provides a smooth, wet surface for the photo-resist and ARC coatings to spread over and helps to break the surface tension of the photo-resist and ARC as it spreads.

However, problems have arisen with the use of this system of dispensing. While the photo-resist or ARC coatings are being dispensed, the semiconductor wafer spins at a relatively high spin speed. This high speed causes the pre-wet solution that has already reached the outer portions of the wafer to dry before the photo-resist or ARC reaches the outer portions. The dry surface prevents even coating by the photo-resist and ARC coatings and leads to manufacturing defects. To reduce these manufacturing defects, additional photo-resist or ARC has been used. However, these solutions are extremely expensive. In particular, the photo-resist can cost up to $10,000 per gallon.

SUMMARY

There is a need for an improved coating system and method that maintains the wet condition on the surface of the semiconductor wafer created by the pre-wet solvent until the photo-resist and ARC coatings have completely covered the wafer. This may provide the potential to reduce the amount of expensive photo-resist needed for a given lithography step.

According to aspects of the present disclosure, a semiconductor coating system is disclosed that includes three nozzles. The first nozzle is configured to dispense pre-wet solvent onto the wafer. The second nozzle is configured to dispense photo-resist or ARC coating onto the wafer as it spins at a high speed. The photo-resist or ARC coating is spread to the outer portion of the wafer due to the centrifugal force created by the spinning wafer. A third nozzle dispenses additional pre-wet solvent toward an outer portion of the wafer. The third nozzle may begin dispensing at a later time, such as when the second nozzle begins dispensing the photo-resist or ARC coating. This additional pre-wet solvent maintains the wet condition of the wafer to help the photo-resist or ARC coating completely cover the wafer. Accordingly, it may be possible to use less photo-resist or ARC coating to completely coat the wafer.

Further aspects of the disclosure are directed to a multi-nozzle arm that includes the third nozzle discussed previously. Still further aspects are directed to methods for providing an additional dispensing of solvent at an outer portion of the wafer during photo-resist spreading.

These and other aspects of the disclosure will be apparent upon consideration of the following detailed description of illustrative embodiments.

BRIEF DESCRIPTION OF THE DRAWINGS

A more complete understanding of the present invention and the advantages thereof may be acquired by referring to the following description in consideration of the accompanying drawings, in which like reference numbers indicate like features, and wherein.

DETAILED DESCRIPTION OF ILLUSTRATIVE EMBODIMENTS

The various aspects summarized previously may be embodied in various forms. The following description shows by way of illustration various embodiments and configurations in which the aspects may be practiced. It is understood that other embodiments may be utilized, and structural and functional modifications may be made, without departing from the scope of the present disclosure.

Figure 1:
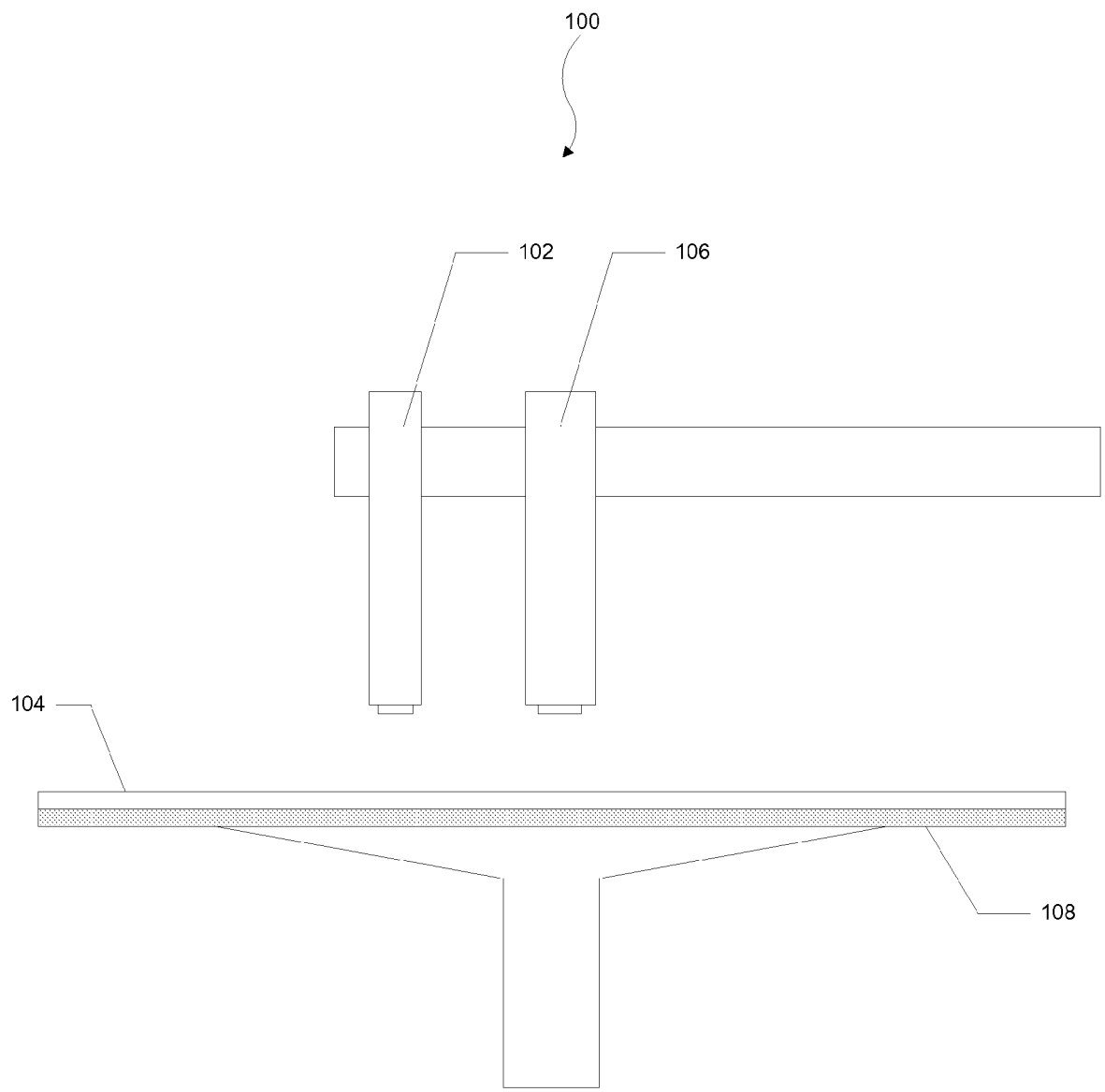
FIG. 1 is illustrative of a conventional coating system.

FIG. 1 illustrates a conventional coating system 100. The system includes a first nozzle 102 for dispensing pre-wet solvent onto the semiconductor wafer 104. In addition, the system 100 includes a second nozzle 106 for dispensing a photo-resist or ARC coating onto the semiconductor wafer 104. This coating is dispensed over the pre-wet solution. The semiconductor wafer 104 may be on a platform 108 that is rotating, thereby causing the wafer to rotate. This rotating motion aids in spreading the photo-resist or ARC coating across the surface of the semiconductor wafer.

One drawback to this system 100 is that the photo-resist or ARC often does not completely cover the surface of the semiconductor wafer 104. As the semiconductor wafer 104 spins at high speeds, the pre-wet solvent near the outer portion of the semiconductor wafer dries before the photo-resist or ARC coating spreads to the outer portion of the semiconductor wafer. This may cause uneven coating and other coating defects on the semiconductor wafer 104. To remedy these coating defects, sufficient photo-resist or ARC coating is applied to help counteract the spreading problem. This is particularly problematic due to the typically high cost of photo-resist or ARC coatings.

Figure 2:
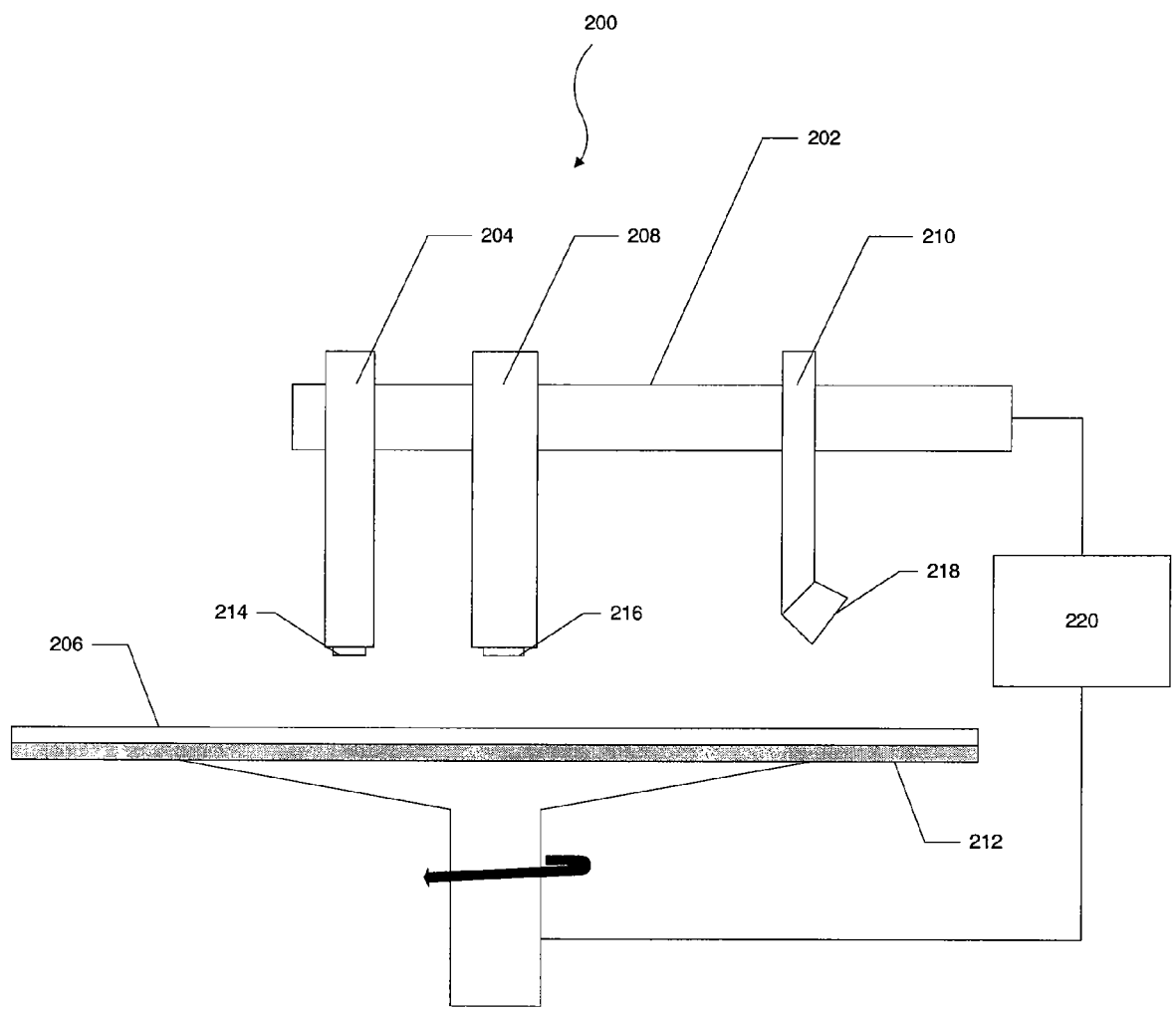
FIG. 2 is illustrative of a coating system including an additional nozzle.

FIG. 2 is a schematic of an illustrative coating system 200. The coating system 200 generally includes a movable arm 202 to which three nozzles are attached. The first nozzle 204 is configured to dispense pre-wet solvent onto a semiconductor wafer 206. The semiconductor wafer 206 may be any size wafer, such as a wafer having a diameter greater than 300 mm. Larger wafer sizes may see increased effectiveness with this configuration. The second nozzle 208 is configured to dispense photo-resist or ARC coating onto the semiconductor wafer 206. The third nozzle 210 is configured to dispense additional pre-wet solvent onto the semiconductor wafer 206. The wafer 206 may be on a platform 212 that may be any appropriate size to accommodate the wafer size. For example, the platform may be 300 mm or larger. The platform is controlled by a controller 220, to rotate at specified times, thereby causing semiconductor wafer 206 to also rotate. Such rotation causes the dispensed pre-wet solvent, photo-resist or ARC to spread across semiconductor wafer 206.

The first nozzle 204 of coating system 200 is configured to dispense pre-wet solvent onto a central portion of the semiconductor wafer 206. The first nozzle 204 includes outlet 214 through which the pre-wet solvent is dispensed. The pre-wet solvent is dispensed to create a wet condition on the surface of the wafer. This wet condition allows the photo-resist or ARC coating to spread smoothly and evenly across the entire surface of the wafer.

The second nozzle 208 of coating system 200 is configured to dispense photo-resist or ARC coating onto the semiconductor wafer 206. The second nozzle 208 includes an outlet 216 through which the photo-resist or ARC coating is dispensed. The coating dispensed from the second nozzle 208 is dispensed on top of the pre-wet solution, such as on the central portion of semiconductor wafer 206. Again, the centrifugal force created by the wafer 206 rotating causes the solution to spread across the surface of the semiconductor wafer 206.

The third nozzle 210 is configured to dispense additional pre-wet solvent onto the semiconductor wafer 206. The pre-wet solvent may be identical to the pre-wet solvent dispensed from the first nozzle 204. The third nozzle 210 includes an outlet 218 through which the additional pre-wet surface is dispensed. The outlet 218 may be a shower-type outlet configured to dispense pre-wet solvent in a directed spray pattern that spreads over an annular area at an outer portion of the semiconductor wafer 206. The spray pattern may spray over an annular area that may be, for example, ⅙ or less of the diameter of the wafer. For instance, where the semiconductor wafer 206 is a 300 mm diameter wafer, the spray pattern may spray or otherwise apply the pre-wet solvent over an annular area 50 mm wide or less, measured in a radial direction of the semiconductor wafer 206. This shower-type nozzle may cause the pre-wet solvent to be directed at an angle toward an outer portion of the semiconductor wafer 206. The third nozzle 210 may begin dispensing pre-wet solvent at a time after the first nozzle 204 begins dispensing, but while the wafer 206 is still rotating. For instance, the third nozzle 210 may begin dispensing at the same time that the second nozzle 208 begins dispensing.

Movable arm 202 may be moved relative to the platform 212 to position the nozzles at the desired location for dispensing. In addition, or alternatively, the nozzles 204, 208, 210 may be moved relative to the movable arm 202 to further position the nozzles for dispensing. The position of the movable arm 202 and nozzles 204, 208, 210 may be controlled by controller 220. In addition, controller 220 may control the rotation of the platform 212. Additionally, or alternatively, the platform 212 may be moved relative to the arm 202.

Figure 3:
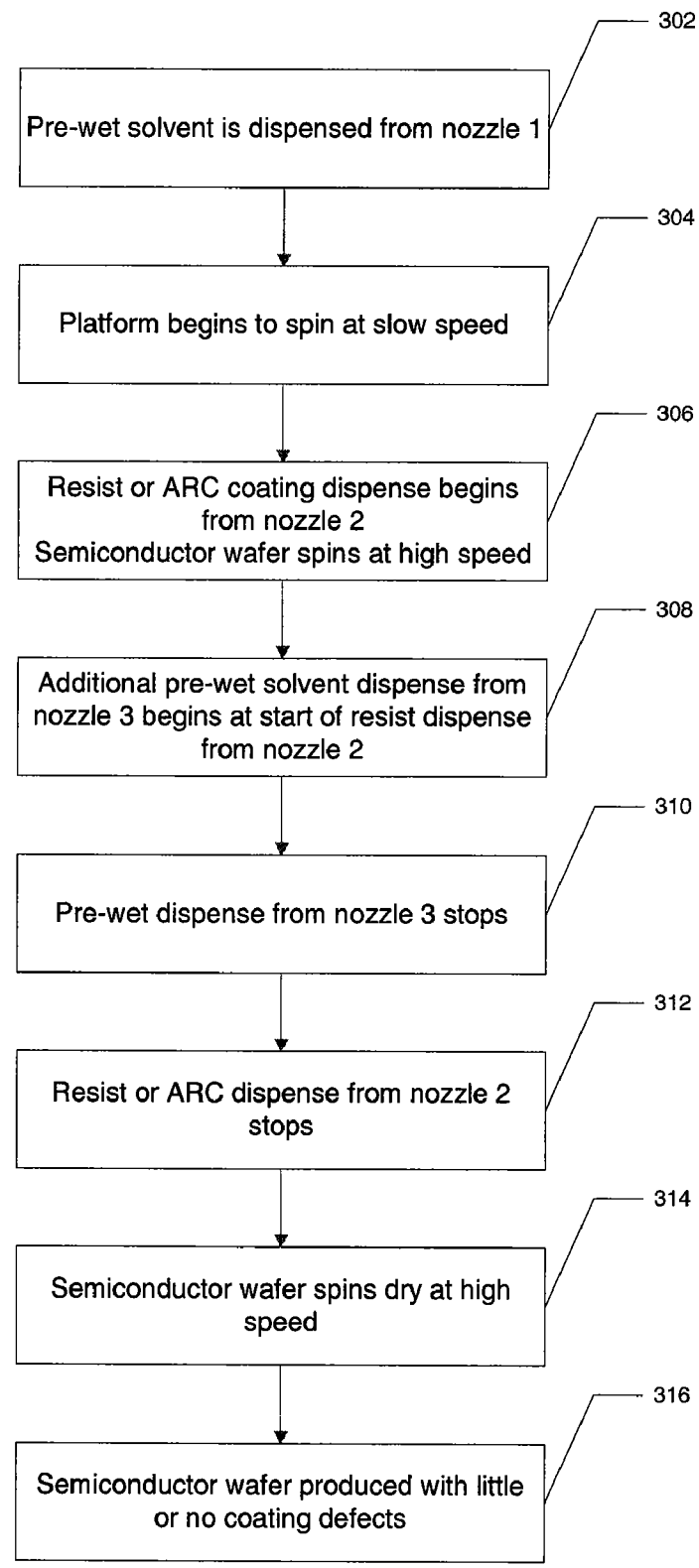
FIG. 3 is a functional block diagram of a coating system having at least three nozzles, in accordance with aspects of the present disclosure.

FIG. 3 is a functional block diagram of an illustrative coating system that ideally provides complete coating of the semiconductor wafer and reduces the amount of photo-resist or ARC coating used. FIG. 3 is merely illustrative of the various embodiments and alternatives described herein. In addition, FIGS. 4A-4F are also illustrative of various steps within the process described in FIG. 3.

Figure 4B:
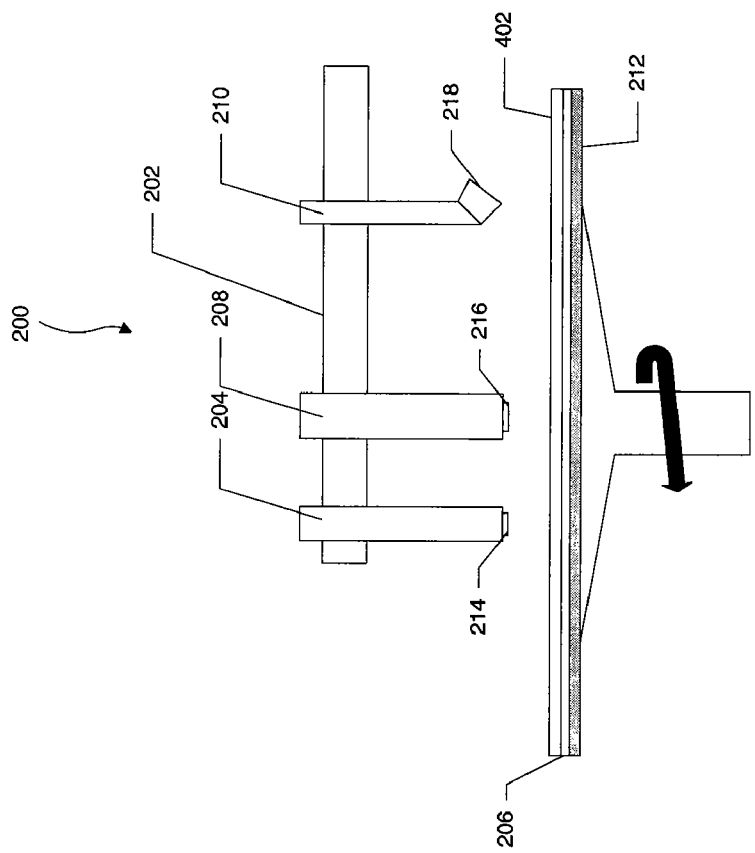
FIG. 4B is illustrative of another step of the coating process described that includes rotating the wafer to distribute the pre-wet solvent across the surface of the wafer.
Figure 4A:
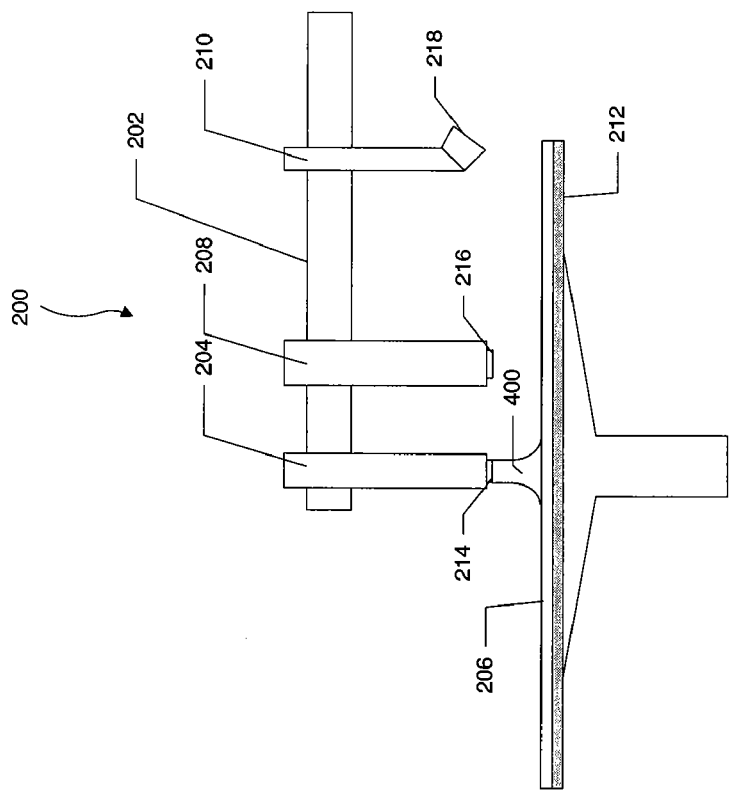
FIG. 4A is illustrative of one step of the coating process described that includes dispensing a pre-wet solvent.

FIG. 3 illustrates the coating process of the present invention. As shown in FIG. 4A, to begin the coating process, pre-wet solvent 400 is dispensed from first nozzle 204 onto a central portion of the semiconductor wafer 206 in step 302. After the pre-wet solvent 400 has been dispensed, the platform 212 on which the semiconductor wafer 206 sits may begin to rotate, thereby rotating the semiconductor wafer 206, as in step 304. Alternatively, the platform 212 and semiconductor wafer 206 may already be rotating at a low speed when the pre-wet solvent 400 is dispensed. This initial rotation is at a low speed, e.g., 500 to 1000 rpm. As the semiconductor wafer 206 rotates, the pre-wet solvent 400 is spread across the surface of the wafer 206 creating a thin solvent fluid film 402, as seen in FIG. 4B. The thin solvent fluid film 402 created by the pre-wet solvent 400 allows for easier and more complete spreading of coatings dispensed in later steps of the process, and therefore results in consumption of smaller amounts of those coatings.

Figure 4C:
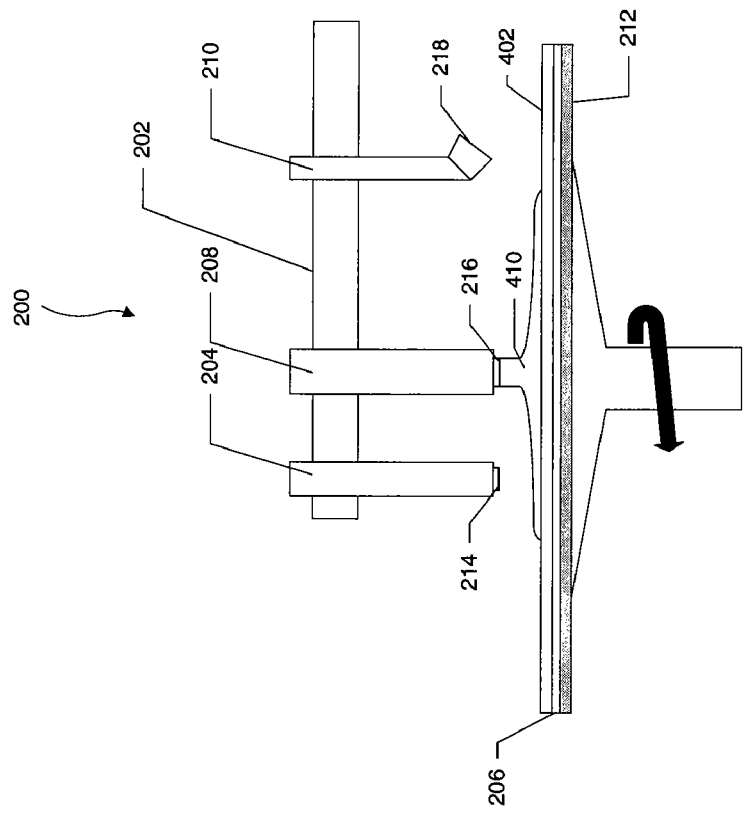
FIG. 4C is illustrative of yet another step of the coating process described in which photo-resist or ARC coating is dispensed onto the wafer and additional pre-wet solvent is also dispensed.

As illustrated in FIG. 4C, after the pre-wet solvent spreads across the surface of the semiconductor wafer 206, second nozzle 208 dispenses a photo-resist or ARC coating 410 onto a central portion of the spinning wafer 206 in step 306. As the photo-resist or ARC coating 410 is dispensed (and/or immediately after), the semiconductor wafer 206 spins at a high speed, e.g., 3000 to 5000 rpm. The spin of the wafer 206 causes the photo-resist or ARC coating 410 to spread smoothly across the surface of the wafer 206, over the thin solvent fluid film 402 created by the pre-wet solvent 400.

As the photo-resist or ARC coating 410 is dispensed, additional pre-wet solvent 400 is dispensed from third nozzle 210 in step 308. The third nozzle 210 may be a shower-type nozzle and may be configured to direct the pre-wet solvent 400 toward the outer portion of the semiconductor wafer 206. As the semiconductor wafer 206 continues to spin at high speed, the additional pre-wet solvent 400 may help maintain the thin solvent fluid film 402 created in step 302, especially near the perimeter of the wafer 206. The additional pre-wet solvent 400 maintains the wet condition at the outer portion of the semiconductor wafer 206 so that the photo-resist or ARC coating 410 may spread more completely and evenly over the entire surface of the semiconductor wafer 206. This is also desirable because less photo-resist or ARC 410 may be necessary to completely coat the wafer 206. As photo-resist and ARC 410 are very expensive, any reduction in the amounts needed can be a major business advantage.

Figure 4D:
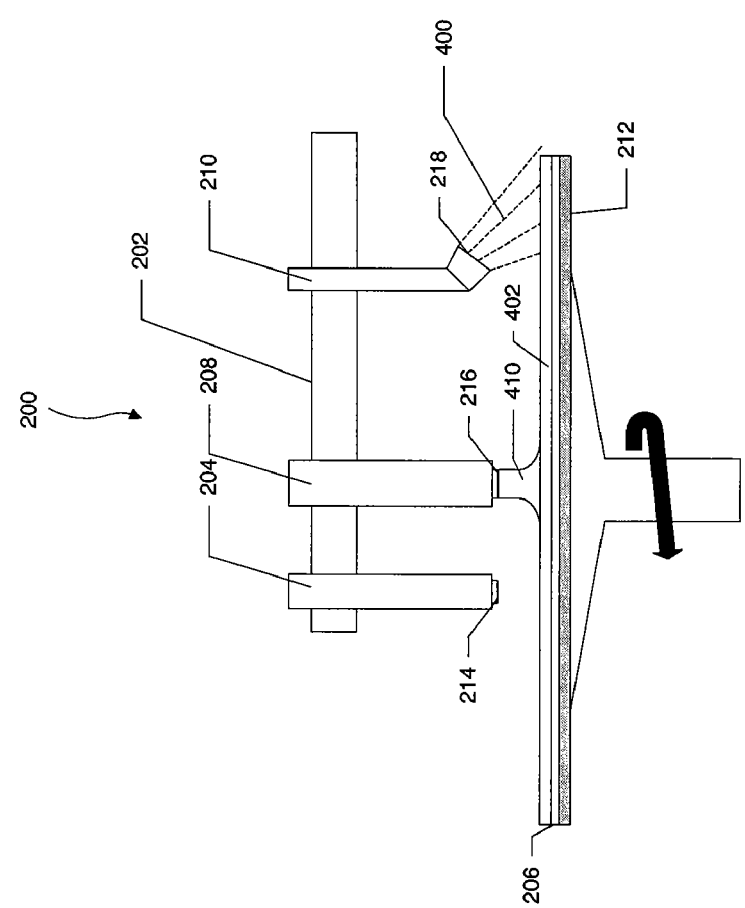
FIG. 4D is illustrative of yet another step of the coating process described in which the wafer spins at a higher speed to distribute the photo-resist or ARC coating across the surface of the wafer.
Figure 4F:
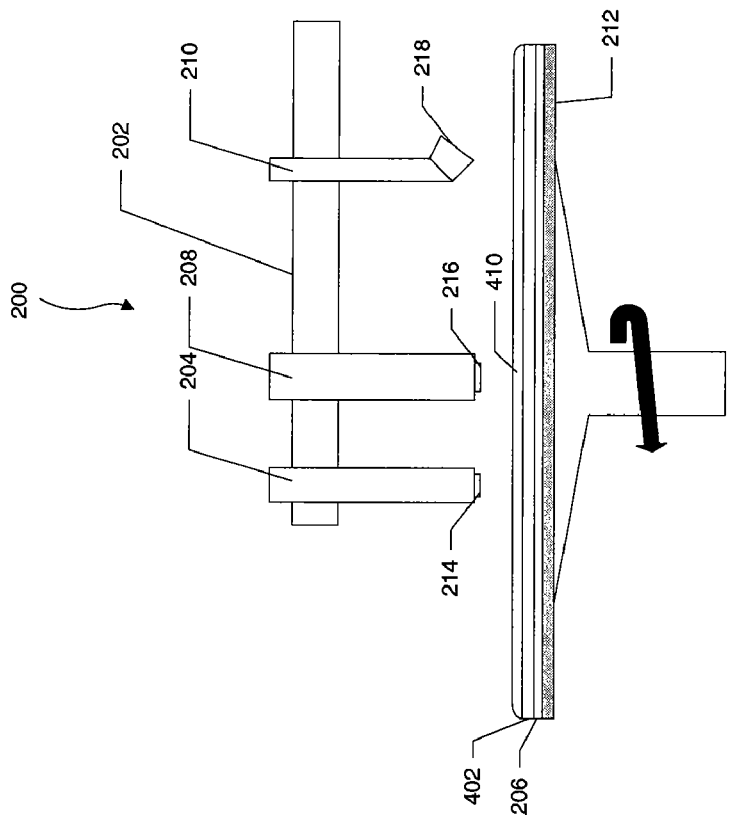
FIG. 4F is illustrative of another step of the coating process described in which the wafer continues to rotate until the photo-resist or ARC coating is dry.
Figure 4E:
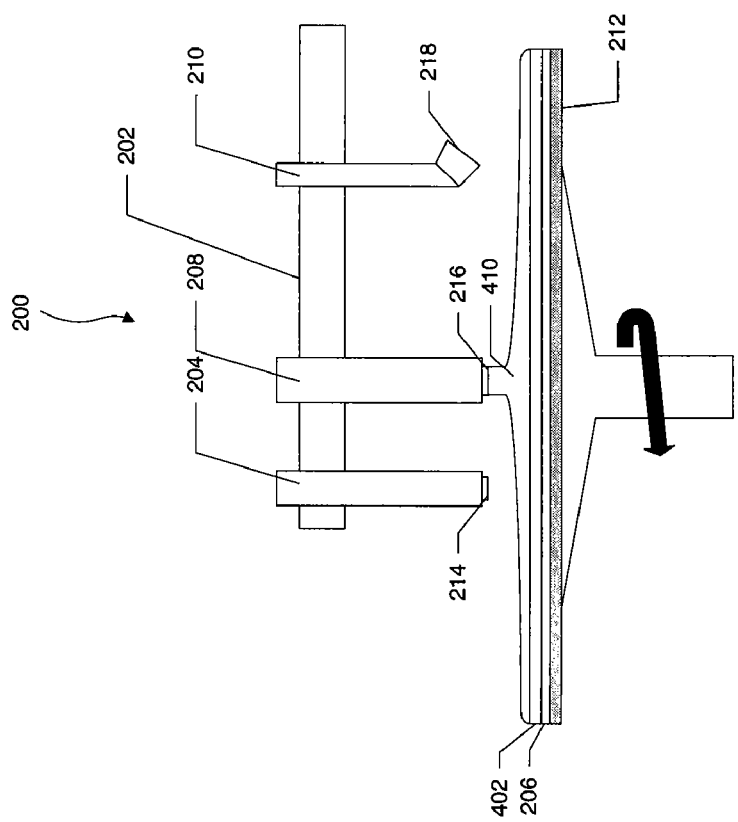
FIG. 4E is illustrative of still another step of the coating process described in which the wafer continues to rotate until the photo-resist or ARC completely coats the surface of the wafer.

In step 310, the third nozzle 210 may stop dispensing additional pre-wet solvent 400. Although additional pre-wet solvent 400 is not being dispensed, the photo-resist or ARC coating 410 may continue to be dispensed from the second nozzle 208, as seen in FIG. 4D. The second nozzle 208 may continue dispensing until sufficient photo-resist or ARC 410 has been dispensed to cover the wafer 206, as shown in FIG. 4E. In step 312, the second nozzle 208 will then stop dispensing photo-resist or ARC coating 410. Although no additional photo-resist, ARC 410 or pre-wet solvent 400 is being dispensed, the semiconductor wafer 206 continues to rotate at a high speed in step 314 until dry. As shown in FIG. 4F, the photo-resist or ARC coating 410 may then be spread evenly and completely across the entire surface of the semiconductor wafer 206 producing semiconductor wafers 206 with much fewer coating defects, as in step 316.

Thus, an improved coating system, such as a three nozzle coating system, has been described. Using such a system will provide more uniform coating of semiconductor wafers and will utilize a minimum amount of photo-resist or ARC coatings, thereby producing wafers with few coating defects and at a reduced cost.

What is claimed is:

1. A method for coating a semiconductor wafer, comprising the steps of:
   placing a semiconductor wafer on a platform that is rotatable;
   dispensing a first solution from a first nozzle onto the semiconductor wafer;
   rotating the semiconductor wafer at a first speed while the first solution is dispensed on the semiconductor wafer;
   dispensing a second solution, different from the first solution, from a second nozzle onto the semiconductor wafer, the second solution being dispensed onto the semiconductor wafer while the first solution is still wet on the semiconductor wafer as it rotates at a second speed higher than the first speed; and
   dispensing additional first solution from a third nozzle onto the semiconductor wafer while the semiconductor wafer continues to spin at a speed higher than the first speed, wherein the third nozzle is a shower-type nozzle.

2. The method of claim 1, wherein the first solution is a pre-wet solvent.

3. The method of claim 2, wherein the second solution is photo-resist coating.

4. The method of claim 2, wherein the second solution is an anti-reflective coating.

5. The method of claim 1, wherein the first speed is in a range about 500 to 1000 rpm.

6. The method of claim 1, wherein the second speed is in a range about 3000 to 5000 rpm.

7. The method of claim 1, wherein the semiconductor wafer is at least 300 mm in diameter.

8. The method of claim 1, wherein the step of dispensing the additional first solution further comprises directing the solution toward an outer portion of the semiconductor wafer.

9. The method of claim 8, wherein the outer portion of the semiconductor wafer is an annular region 50 mm or less in a radial direction of the semiconductor wafer.

10. The method of claim 8, wherein the outer portion of the wafer is one-sixth of the diameter of the semiconductor wafer.

11. A method for coating a semiconductor wafer, comprising the steps of:
    dispensing a pre-wet solvent from a first nozzle onto the semiconductor wafer;
    rotating the semiconductor wafer at a first rate in a range of about 500 to 1000 rpm while the pre-wet solvent dispensed from the first nozzle is dispersed on the semiconductor wafer;
    dispensing a photo-resist solution from a second nozzle onto the semiconductor wafer as it spins at a second rate in a range of about 3000 to 5000 rpm;
    dispensing pre-wet solvent from a third nozzle onto the semiconductor wafer as it rotates at the second rate, wherein the solvent from the third nozzle is directed toward an outer portion of the semiconductor wafer, and wherein the third nozzle is a shower-type nozzle; and
    stopping the third nozzle from dispensing the pre-wet solvent before the photo-resist solution spreads to the outer portion of the semiconductor wafer and while the semiconductor wafer continues to rotate at the second speed.

12. The method of claim 11, wherein the semiconductor wafer is at least 300 mm in diameter.

13. The method of claim 11, wherein the outer portion of the semiconductor wafer is an annular region 50 mm or less in a radial direction of the semiconductor wafer.

* * * * *